(12) United States Patent
Jin

(10) Patent No.: US 8,941,424 B2
(45) Date of Patent: Jan. 27, 2015

(54) DIGITAL PHASE LOCKED LOOP WITH REDUCED CONVERGENCE TIME

(71) Applicant: Microsemi Semiconductor ULC, Kanata (CA)

(72) Inventor: Qu Gary Jin, Kanata (CA)

(73) Assignee: Microsemi Semiconductor ULC, Kanata, ON (CA)

( * ) Notice: Subject to any disclaimer, the term of this patent is extended or adjusted under 35 U.S.C. 154(b) by 0 days.

(21) Appl. No.: 14/311,638

(22) Filed: Jun. 23, 2014

(65) Prior Publication Data

US 2015/0002198 A1 Jan. 1, 2015

Related U.S. Application Data

(60) Provisional application No. 61/839,937, filed on Jun. 27, 2013.

(51) Int. Cl.
*H03L 7/06* (2006.01)
*H03L 7/093* (2006.01)
*H03L 7/14* (2006.01)

(52) U.S. Cl.
CPC ............... *H03L 7/093* (2013.01); *H03L 7/145* (2013.01); *H03L 2207/50* (2013.01); *H03L 2207/18* (2013.01)
USPC ............................. 327/159; 327/149; 327/158

(58) Field of Classification Search
USPC .......................................... 327/149, 158, 159
See application file for complete search history.

(56) References Cited

U.S. PATENT DOCUMENTS

| 5,056,054 | A | * | 10/1991 | Wong et al. ................... 708/300 |
| 7,126,429 | B2 | | 10/2006 | Mitric |
| 7,242,740 | B2 | | 7/2007 | Spijker et al. |
| 7,786,811 | B2 | | 8/2010 | Jin |
| 8,274,325 | B2 | * | 9/2012 | Lamanna et al. ............. 327/553 |
| 8,278,984 | B2 | * | 10/2012 | Lamanna et al. ............. 327/156 |
| 2011/0012652 | A1 | * | 1/2011 | Lamanna et al. ............. 327/156 |

(Continued)

OTHER PUBLICATIONS

"Noise Properties of PLL Systems", Venceslav F. Kroupa, IEEE Transactions on Communications, vol. Com-30, No. 10, Oct. 1982, pp. 2244-2252.

(Continued)

*Primary Examiner* — Adam Houston
(74) *Attorney, Agent, or Firm* — Marks & Clerk; Richard J. Mitchell

(57) ABSTRACT

A digital phase locked loop has a digital controlled oscillator, a phase comparator comparing the output signal of the digital controlled oscillator, or a signal derived therefrom, with a reference signal to produce a phase error signal. A loop filter produces a control signal for the digital controlled oscillator from an output of the phase comparator the loop filter. The loop filter has a proportional part producing a proportional component of the control signal, an integral part producing an integral component of the control signal, and an adder receiving the respective proportional and integral components at first and second inputs thereof to produce the control signal. The integral part includes a delayed feedback loop normally configured to accept the integral component at an input thereof. A first switch replaces the integral component at the input of the delayed feedback loop by the control signal in response to an activation signal. A control module produces the activation signal to activate the switch for brief periods when the phase error is non-zero and the rate of change of phase is less than a threshold value.

16 Claims, 2 Drawing Sheets

(56) References Cited

U.S. PATENT DOCUMENTS

| | | | |
|---|---|---|---|
| 2011/0025386 A1* | 2/2011 | Lamanna et al. | 327/156 |
| 2011/0148489 A1* | 6/2011 | August et al. | 327/159 |
| 2011/0156777 A1* | 6/2011 | Wei et al. | 327/157 |
| 2013/0002317 A1* | 1/2013 | Frantzeskakis et al. | 327/156 |
| 2013/0082636 A1* | 4/2013 | Ohori et al. | 318/723 |
| 2014/0062549 A1* | 3/2014 | Navid | 327/156 |
| 2014/0070734 A1* | 3/2014 | Aweya et al. | 318/41 |
| 2014/0197900 A1* | 7/2014 | Kalusalingam et al. | 333/32 |

OTHER PUBLICATIONS

"A Survey of Digital Phase-Locked Loops", William C. Lindsey, et al., Proceedings of the IEEE, vol. 69, No. 4, Apr. 1981, pp. 410-431.

* cited by examiner

DIGITAL PHASE LOCKED LOOP WITH REDUCED CONVERGENCE TIME

CROSS REFERENCE TO RELATED APPLICATION

This application claims the benefit under 35 USC 119(e) of U.S. provisional application No. 61/839,937 filed Jun. 27, 2013.

FIELD OF INVENTION

This invention relates to the field of phase locked loops (DPLLs), and in particular to digital phase locked loops with second order loop filters.

BACKGROUND OF THE INVENTION

A digital phase locked loop (DPLL) in general comprises a phase comparator, a loop filter, a controlled oscillator, and a feedback path. The feedback signal is compared with a reference signal to generate an error signal. The loop filter filters the error signal to generate the control signal for the digital controlled oscillator. In this way the output of the phase locked loop is locked to the reference signal. The convergence time is the time it takes for the output to lock on to the reference signal and is proportional to the filter bandwidth. A low filter bandwidth is desirable to reduce jitter but this implies a long convergence time.

In one type of DPLL, known as a type II PLL, the loop filter is of second order. The loop filter has two parts, known as the proportional or P-part, and integral I-part, which generate corresponding components of the DCO frequency control signal. The I-part accumulates the phase errors into a frequency offset, which is added to the instantaneous phase from the P-part in each cycle. The convergence time is normally dominated by the P-part. However, when the frequency is in lock with the reference signal and the I-part has a small frequency offset, the residual phase convergence time is governed by the small error from the I-part. Under these circumstances the phase error can change extremely slowly, especially when the loop bandwidth is low.

A typical type II DPLL, shown in FIG. 1, comprises a phase comparator 10, a loop filter 11, and a digital controlled oscillator (DCO) 12. The DCO 12 comprises an adder 13 and unit delay memory 14 together forming an integrator with input digital frequency df. $\Phi_e$ is the phase error between the reference clock $\Phi_{ref}$ and the local DCO 12 output or some derivative thereof, for example, a fraction thereof, potentially with some preset offset, with $\Phi_e$ being the output of phase comparator 10. It will be understood that the whole circuit operates under the control of a system clock (not shown).

In this loop filter 11, the P-part 8 consists of multiplier 15, which multiplies the output $\Phi_e$ of the phase comparator 10 by the scaling factor P, and the I-part 9, which consists of multiplier 16 having the scaling factor I as an input, and an integrator, the integrator consisting of adder 17 and memory 18 with unit delay forming part of a delayed feedback loop. The P-part 8 produces a phase compensation component $df_p$ and the I-part produces an integral component $df_I$, representing a frequency offset relative to the frequency of the reference clock $\Phi_{ref}$. The components $df_p$ and $df_I$ are further summed in adder 20 to produce a control signal df which is arranged to set the frequency of the DCO 12 so that it becomes locked to the reference clock $\Phi_{ref}$.

The memory 18 stores the value of the frequency component $df_I$ for one cycle so that the current input $df_I$ to the adder 20 is $df_I$ (previous cycle)+I*$df_p$ (current). Consequently the DCO control signal df at the output of the adders is given by df=$df_p$ (current)+$df_I$ (previous cycle)+I*$df_p$ (current).

The loop bandwidth is generally set by user and is determined by the scaling factor P, which is typically set to be: P=$2\pi f/f_{sys}$, where f is the loop bandwidth and $f_{sys}$ is the system clock for the DPLL loop. The P-part will give an instantaneous PLL update value $df_p$. The scaling factor I, which is input to the multiplier 16, maintains the filter integral part at a very low rate in relation to the P part and in general: I=P/D, where D>>1 is a damping factor.

The DPLL convergence time is proportional to the loop bandwidth and hence is dominated by the P value, which is the input to multiplier 15 as shown in FIG. 1. However, at low bandwidths, when the frequency is in lock, but potentially with a small frequency offset, any small residual phase error $\Phi_e$ will slowly converge to zero responsive to the value of the scaling factor I. In many cases, the convergence could take days, for example, at 1 mHz bandwidth. This is unacceptable for PLL applications and in particular data transmission. In order to speed up the convergence time, it would be theoretically possible to either increase the values of factors P or I. However, the value for scaling factor P is determined by bandwidth and the value for scaling factor I determines the DPLL frequency response. Changing either of them will impact the PLL frequency response and/or the desired bandwidth behavior of the DPLL.

SUMMARY OF THE INVENTION

In accordance with embodiments of the invention the convergence is still controlled by the value of scaling factor P without changing the DPLL behavior and bandwidth. Both the P and I values may remain unchanged from their values in a conventional type II PLL, but under certain conditions the integral portion of the loop filter is adjusted for a short amount of time so that df is fed back the memory instead of $df_I$.

According to the present invention there is provided a digital phase locked loop comprising: a digital controlled oscillator configured to produce an output signal having a frequency; a phase comparator configured to compare said output signal, or a signal derived therefrom, with a reference signal to produce a phase error signal; a loop filter configured to produce a control signal for said digital controlled oscillator from an output of said phase comparator, said loop filter comprising a proportional part producing a proportional component of said control signal, an integral part producing an integral component of said control signal, and an adder configured to receive said respective proportional and integral components at first and second inputs thereof to produce said control signal, said integral part including a delayed feedback loop normally configured to accept said integral component at an input thereof; a first switch for replacing said integral component at the input of said delayed feedback loop by said control signal in response to an activation signal; and a control module configured to produce said activation signal to activate said switch for brief periods when, the phase error is non-zero and the rate of change of phase is less than a threshold value.

Generally as will be explained below slow phase lock occurs when the frequency is in lock. Although the frequency control is normally dominated by the proportional part, which ensures rapid response times since no integration is involved, a condition can arise where there is a non-zero phase error but the integral component (which is non-dominant) just cancels out the proportional component so that df=0 (i.e. the frequency is in lock). At this point, since the phase error is non zero and the integral component becomes dominant, leading to slow response times. When this happens, even though the phase error is non-zero, the output of adder is zero, which means that the DCO is running correctly at the nominal frequency, but there is a fixed phase offset. As the integrator accumulates phase error, the frequency difference df will gradually change to correct the phase error, but this will take an unacceptably long time due to the integration involved and loop bandwidth. In accordance with embodiments of the invention, the input of the integrator is switched to the output of the adder for brief periods when the condition is detected that the rate of change of phase is below a threshold and the phase error is non zero.

It will be appreciated that the phase comparator may directly compare the output signal with the input signal, or alternatively, it may compare a derived signal, such as a sub-multiple of the output signal.

In one embodiment the delayed feedback loop comprises a memory, and the switch is configured to normally apply said integral component to an input of said memory to selectively apply said control signal to said input of said memory in the presence of said activation signal. It will be appreciated in this context that the activation signal could be created by removing a signal from the switch and such an embodiment falls within the scope of the invention. It does not make any difference whether a signal is normally applied to the switch to hold it in the normal state and the signal is removed to change the switch to the speed state, or vice versa.

Embodiments of the invention are based on the fact that if the frequency has converged (is in lock), the integral component $df_I$ at the output of the integral part should be 0 ppm (parts per million) compared with the frequency of the reference clock. Under these circumstances the phase component $df_p$ should normally eliminate any residual phase error within a given time period.

However, when the integral component $df_I$, which represents the frequency offset, has a non-zero value that is canceled out by the residual phase error such that the sum of the proportional and integral components is zero, the phase component $df_p$ cannot eliminate the phase error, and the convergence time is governed by the behavior of the I-part. In this circumstance, when it is determined that the phase error is not changing rapidly enough, the control signal df is fed back to the I-part instead of the output of the I-part for one cycle. This action allows the P-part to govern the convergence.

To avoid false detection, preferably the DPLL should be stable, i.e. the sign of the phase component $df_p$ should not change in the given time period.

With this arrangement it is possible to speed up the remaining phase convergence of a DPLL with very low loop bandwidth.

According to another aspect of the invention there is provided a method of reducing the convergence time in a digital phase locked loop, comprising comparing the phase of an output signal having phase and frequency, or a signal derived therefrom, with a reference signal to produce a phase error signal; filtering said phase error signal in a loop filter having a proportional part producing a proportional component and a integral part producing an integral component, said integral part including a delayed feedback loop normally receiving at an input thereof said integral component; applying the proportional and integral components to respective first and second inputs of an adder to produce a control signal; and replacing the integral component at the input of the delayed feedback loop with the produced control signal for brief periods when the phase error signal is non-zero and the rate of change of phase is less than a threshold value.

BRIEF DESCRIPTION OF THE DRAWINGS

The invention will now be described in more detail, by way of example only, with reference to the accompanying drawings, in which:—

DETAILED DESCRIPTION OF AN EMBODIMENT OF THE INVENTION

Figure 1:
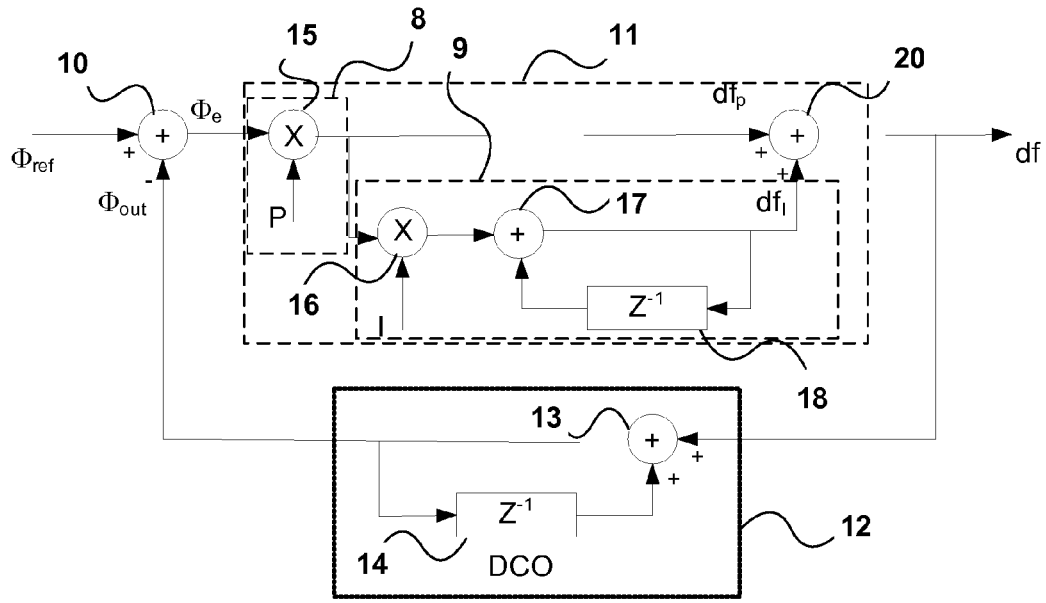
FIG. 1 is a block diagram of a prior art DPLL.

In a traditional DPLL architecture as shown in FIG. 1, the filter response H(z) is given by the expression:

$$H(z) = \frac{P + I - PZ^{-1}}{1 + P + I - (2 + P)Z^{-1} + Z^{-2}}$$

where P and I are the scaling factors for the proportional and integral parts respectively. When I<<P, the frequency response becomes a first order system $$H(z) = \frac{P}{1 + P - Z^{-1}}$$

The DPLL bandwidth is determined by the pole, which is only related to the value of the scaling factor P. However, the DPLL behavior changes when the control signal $df=(df_p+df_I)$ equals or is close to zero ppm (parts per million), but $\Phi_e$ is a non-zero value. In this case, if df=0, and therefore $df_p+df_I=0$. If $\Phi_e$ is non-zero, $df_I$ must have a small frequency offset $df_I=-df_p=-P*\Phi_e$ so that the sum $df_p+df_I=df=0$. It will be appreciated that the reference frequency itself can have a small offset relative to its nominal value. In this case when the output frequency is locked relative to the actual reference frequency, i.e. has zero ppm offset relative to the actual reference frequency, df will be non zero. In this situation the phase convergence relies on the frequency convergence of $df_I$ instead of the phase convergence of $df_p$ to remove the residual phase error. The frequency convergence, which depends on the output of the integral part, is much slower than phase convergence since it involves integration. The time constant of the integral part depends on the value of scaling factor I, which as described above is D times smaller than the value of scaling factor P. If the DPLL bandwidth is 1 mHz and D=100, the convergence time will be proportional to 100,000 sec., which makes the device almost unusable.

Figure 2:
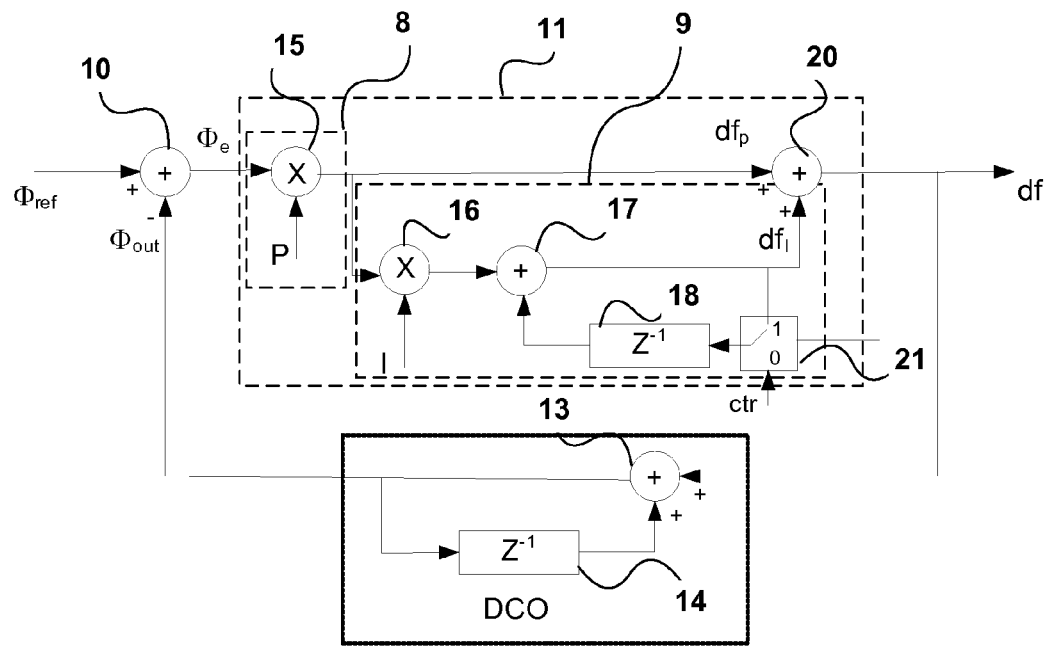
FIG. 2 is a block diagram of a DPLL with an accelerator module in accordance with an embodiment of the invention.

The architecture shown in FIG. 2 speeds up the remaining phase convergence without changing the DPLL bandwidth. From the above analysis, it is known that a DPLL slows down its convergence time by a factor of D when df has already converged with 0 ppm offset relative to the reference signal (i.e. the frequency is in lock) but the component $df_I$ still has a small offset causing a residual phase error as explained above. In an exemplary embodiment, when the df value is at zero, by momentarily setting the input to the delayed feedback loop in the I-part equal to the df value, the component $df_p$, which now corresponds to the phase error $\Phi_e$, will be able to pull-in remaining phase with the normal DPLL bandwidth dominated by the value P.

Comparing FIGS. 1 and 2, the only difference lies in the presence of the control switch 21 responsive to activation signal ctr in the $df_I$ feedback path at the input of the adder 20. The switch has inputs 0, 1, responsive to the values of activation signal ctr. During normal operation, activation signal ctr is set to state 0, and the control switch 21 is thus set to input 0. The DPLL operates in exactly the same way as in FIG. 1 with the integral component $df_I$ applied to the input of the adder 20 also applied to the input of unit delay memory 18 in the delayed feedback loop. When frequency lock is detected, i.e. when df is zero ppm related to the reference, indicative that the output of the DCO 12 is locked in frequency to the reference clock $\Phi_{ref}$ (possibly with a small frequency offset) and the phase of the DCO 12 has not been locked to the phase of reference clock $\Phi_{ref}$, i.e. $\Phi_e$ is a non-zero value, and the rate of change of phase is less than a threshold value, the activation signal ctr is set to 1. The activation signal ctr thus switches control switch 21 to input 1 for one system cycle to put the DPLL into speed mode.

When the switch 21 is set to input 1, the control signal df is applied to the input of unit delay memory 18, which stores its value for one cycle. In the next cycle, the input $df_I$ to the adder 20 becomes df (previous cycle)+I*$df_P$ (current) and the control signal df becomes df=$df_P$ (current)+df (previous cycle)+I*$df_P$ (current). This operation replaces the component $df_1$ (previous) to the input $df_1$ with df (previous cycle) and thus pushes the control signal df up by an amount $df_p$, since df (previous cycle) output by delay memory 18 is zero ppm related to the reference, i.e. $df_1$ (previous) of the prior art is now replaced by the locked frequency df.

The residual phase is then pulled-in at the DPLL bandwidth with correct $df_I$ value. Consequently, when the switch 21 returns to the normal 0 input, since the frequency was already in lock, assuming the frequency has not changed, ($df_p$+$df_I$) will still equal zero ppm, but this time the phase error $\Phi_e$ also equal to zero, so in this case $df_p$=0 and $df_I$ is locked to reference frequency with zero offset.

Preferably, the control module, which generates signal ctr, is arranged so that $df_I$ is replaced by df when the frequency is in lock and the rate of change of phase is less than a threshold value. An exemplary control module for achieving this result is shown in FIG. 3.

Figure 3:
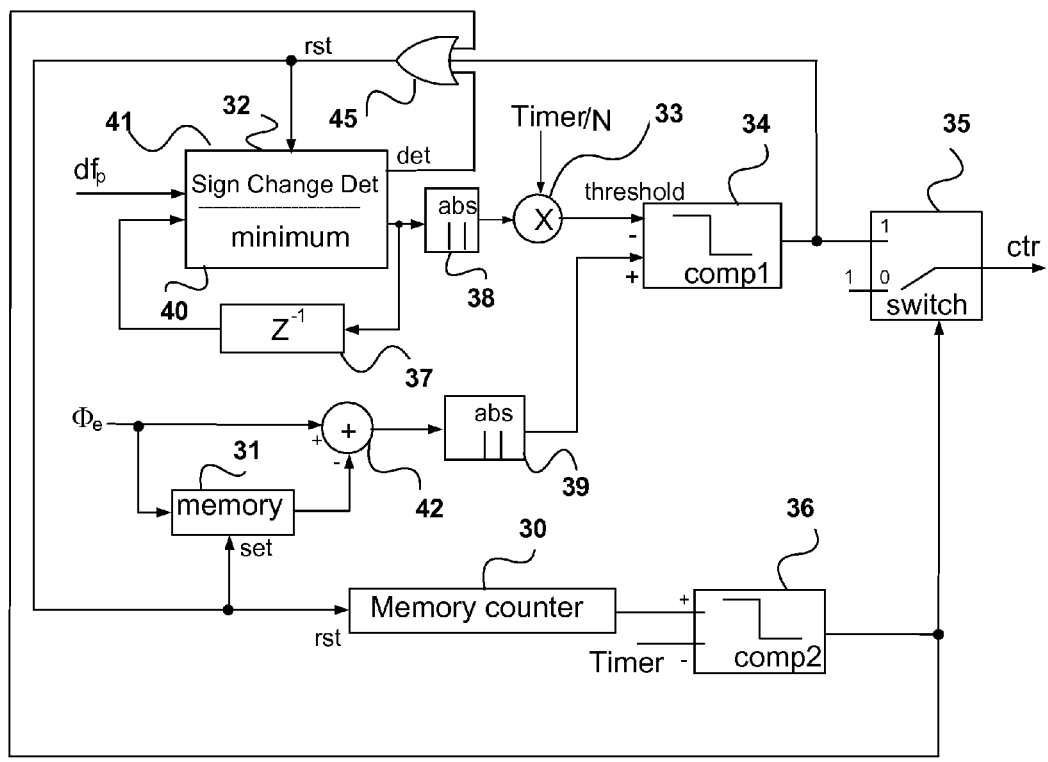
FIG. 3 is a block diagram of the control logic circuit for the DPLL of FIG. 2.

In FIG. 3, the memory counter 30 counts the elapsed time from each reset rst, which occurs when any of the following conditions are met: the count in the counter 30 reaches a preset value Timer as determined by comparator 36, indicating the expiry of a preset time period T; the output of the comparator 34 is active, indicating that the phase error has changed by an acceptable amount within a preset time period T; or when a sign change is detected by the sign change detector 41, as will be explained further below. Disregarding the other conditions of reset, when the count in the counter 30 reaches preset value Timer the output of comparator 36 is set to active, i.e. to a 1, and in the absence of this condition, the output of comparator 36 is set to inactive, i.e. to a 0. The output of the comparator 36 is coupled to one input of the OR gate 45, and is further coupled to the control input of the switch 35. The output of the OR gate 45 is labeled signal rst. Thus, when the output of the comparator 36 is a 1, this acts as a switch signal to set the switch 35 to position 0 for one cycle, as will be described further below, and signal rst is set to 1.

Memory counter 30 counts clock cycles for the DPLL of FIG. 2 to establish the preset time periods T determined by the system clock rate and the value of Timer. If the phase error has not changed by more than a predetermined amount within a preset time period T, a determination is made that the phase error is changing at an inadequate rate, and the DPLL is placed in speed mode.

The difference generator 42 determines the difference between the current phase error value $\Phi_e$, received at the positive input thereof, and a value stored in the memory 31, received at the negative input thereof. This value stored in memory 31 is updated with the phase error value $\Phi_e$ at each active signal rst, shown as the set input to the memory 31. Absolute value block 39 applies the magnitude of the output of difference generator 42 to the positive input of comparator 34.

If the magnitude of difference between the current phase error value $\Phi_e$ and the value stored in the memory 31 is less than a threshold that is received at the negative input of comparator 34, the output of comparator 34 is set to zero; when the difference exceeds the preselected threshold the output of the comparator 34 is set to 1. If the phase change error exceeds the threshold before the memory counter 30 reaches the value Timer, i.e. within a preset time period T, this indicates that the phase error is changing at an acceptable rate; failure to reach the threshold within this preset time period P indicates that it is not, implying that the DPLL should be put into speed mode.

When the output of comparator 34 is active, i.e. set to 1, indicating that the phase error change has exceeded the threshold, signal rst becomes active, and thus memory 31 is set, and the memory counter 30 is reset by signal rst. This action restarts the preset time period T. The difference generator 42 also sets the comparator 34 back to 0 since initially the current and stored values of the phases error $\Phi_e$ will be the same.

The switch 35 has two inputs, denoted 0, 1 determined by the alternate values output by the comparator 36. Input 0 is permanently set to 1. The value at input 1 depends on the output of the comparator 34, as described above. Since the output of the comparator 36 is normally 0, activation signal ctr is normally set to input 1, which has a fixed value 1, thus ensuring normal DPLL operation.

At the expiry of the memory counter 30, when the comparator 36 generates an active output, the switch 35 is set to input 1 for one cycle, thus passing the output of the comparator 34 to the activation signal ctr. Assuming the output of the comparator 34 is set to zero, indicating that the phase error is changing at an unacceptable rate, the activation signal ctr is set to 0, and as a result the switch 21 is set to the 0 position to put the DPLL in speed mode as described above with reference to FIG. 2. If at the expiry of the counter, the output of the comparator 34 switches to a 1, indicating that the phase error change has exceeded the threshold value on the last cycle of period T, the signal ctr will remain a 1. If the comparator switched to a 1 prior to the last cycle of the period T, a reset signal rst would have been generated before the expiry of the period T and the memory counter 31 would never have reached the value Timer.

It is to be understood that if prior to expiry of the time period T determined by the memory counter 30 reaching the value Timer, the phase error $\Phi_e$ has exceeded the threshold, the output of the comparator 34 changes to 1, the signal rst becomes active, and thus memory counter 30 is reset, resulting in the output of comparator 36 returning to 0. As a result, the switch 35 remains in position 0, ctr remains set to 1, and the DPLL continues to operate in normal mode.

An active signal output by the comparator 36 further resets memory counter 30 via OR gate 45, thus ensuring that signal ctr is set to 0 for no more than one cycle because the output of memory counter 30 then becomes less than the value Timer, returning the output of comparator 36 to 0.

The switch over to speed mode (when the memory 18 takes the value of df as its input) happens only when the phase does not change by an amount great than the threshold value over a preset extended period of time determined by the value of the parameter Timer.

Activation of signal rst further triggers phase error memory 31 to update its value with the current phase error value $\Phi_e$. The threshold calculation performed in the Sign Change Detection/Minimum block 32 is also reset responsive to the activation of signal rst.

The Sign Change Detection/Minimum block 32, which includes a sign change detector 41 and a minimum operation module 40, performs two operations. One is to identify the minimum value of $df_p$ in magnitude between each activation of signal rst, which is the period set by Timer for which the phase error value $\Phi_e$ is less than the threshold. This minimum value is stored in the memory 37.

The minimum operation module 40 compares the current input value of $df_p$ with the value of $df_p$ stored in memory 37. In this operation, $df_p$ is compared with, preferably constantly, the feedback minimum value in magnitude delayed by one clock cycle by delay memory 37 so that the minimum value over time is properly stored in the memory 37. The magnitude of this determined minimum value is obtained by absolute value module 38, and is used to determine the threshold by comparator 34, as will be described below. This operation ensures that while the phase error is zero due to the fact that the DPLL frequency and phase are in lock with the reference $\Phi_{ref}$, the threshold will be zero, and comparator 34 will continually generate the reset signal such that the memory counter 30 will never reach the value Timer, and the switch 35 will not be reset.

The other operation is sign change detection in sign change detector 41. Whenever the current value of $df_p$ changes sign relative to the currently stored minimum value during each period set by Timer, sign change detector 41 outputs an active signal det, which is received as an input by OR gate 45, and thus the whole system is reset, including the phase error memory 31 and the memory counter 30. This prevents false phase non-convergence indications in noisy environments, such as the presence of wander and jitter, where the phase is rapidly changing. Thus, memory counter 30 counts clock cycles for which the phase error value $\Phi_e$ is less than the threshold, and will trigger the speed up mechanism for the DPLL of FIG. 2 in the event that the memory counter 31 exceeds value TIMER, and during which time the sign of error value $\Phi_e$ does not change.

The magnitude of the minimum value of $df_p$ is multiplied by a scaling factor (Timer/N) in multiplier 33 and the multiplied value is used as a threshold against which current phase error value $\Phi_e$ is compared by comparator 34, as described above. The threshold value is compared with the magnitude of the change in $\Phi_e$ in comparator 34, with the outcome of the comparator used to set the value for signal ctr.

To maintain stable DPLL operation without too many interruptions, it is generally desirable that the parameter Timer be much larger than the DPLL sampling rate and N be large enough that only small fraction (1/N) of phase is repaired compared with expected value. However, too large a value will slow down the DPLL convergence rate.

The parameters Timer and N can be selected in accordance with design requirements. In one non-limiting exemplary embodiment, Timer=10 sec. and N=10.

The measured DPLL bandwidth is not impacted by the residual phase pulling-in speed-up circuit. As the result of the residual phase pulling-in speed-up circuit, the DPLL will converge to a stable state in a much shorter time. The architecture is described herein in relation to a basic DPLL loop as illustrated in FIG. 2; however the residual phase pulling-in speed up circuit and can be used in combination with any fast lock algorithm implementing a type II DPLL.

If the fast lock algorithm cannot make frequency error to be exactly zero ppm, the novel architecture enabled herein will pull-in the remaining residual frequency and phase in a short time regardless of loop bandwidth.

It should be appreciated by those skilled in the art that any block diagrams herein represent conceptual views of illustrative circuitry embodying the principles of the invention. For example, the various blocks or modules may be implemented in a processor provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. Moreover, it will be understood that the blocks described herein can be implemented as software modules in suitable digital signal processing hardware.

The disclosed architecture is capable of speeding up DPLL frequency and phase convergence with low loop bandwidth. With a small reference frequency variation, embodiments of the can speed-up frequency convergence without limitation of damping factor. Users are not likely to notice the bandwidth change if they are not aware of it.

I claim:

1. A digital phase locked loop comprising:
    a digital controlled oscillator configured to produce an output signal having a frequency;
    a phase comparator configured to compare said output signal, or a signal derived therefrom, with a reference signal to produce a phase error signal;
    a loop filter configured to produce a control signal for said digital controlled oscillator from an output of said phase comparator, said loop filter comprising a proportional part producing a proportional component of said control signal, an integral part producing an integral component of said control signal, and an adder configured to receive said respective proportional and integral components at first and second inputs thereof to produce said control signal, said integral part including a delayed feedback loop normally configured to accept said integral component at an input thereof;
    a first switch for replacing said integral component at the input of said delayed feedback loop by said control signal in response to an activation signal; and
    a control module configured to produce said activation signal to activate said switch for brief periods when the phase error is non-zero and the rate of change of phase is less than a threshold value.

2. A digital phase locked loop comprising as claimed in claim 1, wherein said delayed feedback loop comprises a unit delay memory, and said switch is configured to normally apply said integral component to an input of said unit delay memory to selectively apply said control signal to said input of said unit delay memory in the presence of said activation signal.

3. A digital phase locked loop as claimed in claim 1, wherein the control module comprises a phase error memory configured to store a value of said phase error signal, a difference generator configured to determine the difference between the stored value and a current value of said phase error signal, a first comparator configured to compare said difference with said threshold value, and a second switch configured to produce said activation signal when said difference is less than said threshold value after a preset time.

4. A digital phase locked loop as claimed in claim 3, wherein the second switch has first and second states, said second switch normally being configured to be in the first state wherein no activation signal is produced, and being responsive to a switch signal generated after said preset time to switch to the second state in which said second switch is responsive to an output of said first comparator to produce said activation signal when said difference is less than said threshold value.

5. A digital phase-locked loop as claimed in claim 3, further comprising a counter, and a second comparator configured to compare said count in said counter with a preset value, said second comparator further being configured to produce said switch signal to change said second switch to the second state, and a reset signal to set said memory to store the current value of said phase error signal and to reset said counter when said count reaches said preset value.

6. A digital phase-locked loop as claimed in claim 5, wherein said first comparator is configured to produce said reset signal when said difference exceeds said threshold value.

7. A digital phase-locked loop as claimed in claim 6, further comprising a minimum value detector configured to determine a minimum value of the phase component of said control signal while said counter is counting to said preset value, and a multiplier for scaling said determined minimum value to produce said threshold value.

8. A digital phase-locked loop as claimed in claim 7, wherein the minimum value detector comprises a minimum value memory configured to store the lesser of a current value of the phase component and a value of the phase component delayed by one clock cycle.

9. A digital phase-locked loop as claimed in claim 7, further comprising a sign change detector configured produce said reset signal in the event of a sign change of said proportional component.

10. A method of reducing the convergence time in a digital phase locked loop, comprising:
 comparing the phase of an output signal having phase and frequency, or a signal derived therefrom, with a reference signal to produce a phase error signal;
 filtering said phase error signal in a loop filter having a proportional part producing a proportional component and a integral part producing an integral component, said integral part including a delayed feedback loop normally receiving at an input thereof said integral component;
 applying the proportional and integral components to respective first and second inputs of an adder to produce a control signal; and
 replacing the integral component at the input of the delayed feedback loop with the control signal for brief periods when the phase error signal is non zero, and the rate of change of phase is less than a threshold value.

11. A method as claimed in claim 10, further comprising storing a value of said phase error signal in a phase error memory, determining the difference between the stored value and a current value of said phase error signal, comparing said difference with said threshold value, and replacing the integral component with said control signal when said difference is less than said threshold value after a preset time.

12. A method as claimed in claim 11, further determining a minimum value of the phase component of said control signal during said preset time, and scaling said determined minimum value to produce said threshold value.

13. A method as claimed in claim 12, wherein said minimum value is scaled by a scaling factor equal to said preset time divided by an integer.

14. A method as claimed in claim 13, wherein the minimum value is determined by storing the lesser of a current value of the phase component and a value of the phase component delayed by one clock cycle.

15. A method as claimed in claim 10, wherein the preset time is determined by a timer, and said timer is reset if said difference exceeds said threshold value within said preset time.

16. A method as claimed in claim 15, wherein said timer is reset when a sign change occurs in said proportional component.

* * * * *